United States Patent
Jaimsomporn et al.

(10) Patent No.: US 6,392,432 B1
(45) Date of Patent: May 21, 2002

(54) AUTOMATED PROTECTION OF IC DEVICES FROM EOS (ELECTRO OVER STRESS) DAMAGE DUE TO AN UNDESIRED DC TRANSIENT

(75) Inventors: Yong Jaimsomporn, Pakked Nonthaburi; Surapol Phunyaphinunt, Pathumthani; Tanawat Boutngam, Nonthaburi, all of (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 108 days.

(21) Appl. No.: 09/602,859

(22) Filed: Jun. 26, 2000

(51) Int. Cl.$^7$ .............................................. G01R 31/02
(52) U.S. Cl. ..................................................... 324/760
(58) Field of Search ................................ 324/760, 763, 324/765; 361/18, 86, 88, 100; 365/226, 228

(56) References Cited

U.S. PATENT DOCUMENTS 4,145,620 A * 3/1979 Dice .......................... 307/149

FOREIGN PATENT DOCUMENTS

EP         0500056         8/1992 ........... G01R/31/26

OTHER PUBLICATIONS

Patent Abstracts of Japan, Power Abnormality Detecting Circuit for IC Tester, Publ. No. 10068748, Publication Date Mar. 10, 1998.

Patent Abstracts of Japan, Input Protector, Publ. No. 08211125, Publication Date Aug. 20, 1996.

* cited by examiner

*Primary Examiner*—N. Le
*Assistant Examiner*—Etienne P LeRoux
(74) *Attorney, Agent, or Firm*—Monica H. Choi

(57) ABSTRACT

Nodes of a test station for testing IC devices are monitored to detect for the occurrence of any undesired DC transient. The test station for testing the IC devices includes a testing board for holding the IC devices, at least one voltage supply for biasing the IC devices, and a signal driver source for providing driving signals coupled to the IC devices, during testing of the IC devices. A system for protecting the IC devices from EOS (electro over stress) damage due to the undesired DC transient includes a signal measuring unit that monitors for occurrence of an undesired DC transient at any of the at least one voltage supply, of the signal driver source, and of at least one node of the testing board. The system also includes a data processing unit and a data interface bus coupled between the signal measuring unit and the data processing unit. The signal measuring unit sends, to the data processing unit via the data interface bus, a signal of the undesired DC transient measured at any of the at least one voltage supply, of the signal driver source, and of at least one node of the testing board. The data processing unit determines whether the signal of the undesired DC transient exceeds threshold characteristics. The data processing unit includes an I/O (input/output) controller for controlling components of the test station such that the test station shuts down in a proper sequence when the signal of the undesired DC transient exceeds the threshold characteristics. The testing of the IC devices may resume after such a shutting down of the test station by resetting the test station.

18 Claims, 4 Drawing Sheets

AUTOMATED PROTECTION OF IC DEVICES FROM EOS (ELECTRO OVER STRESS) DAMAGE DUE TO AN UNDESIRED DC TRANSIENT

TECHNICAL FIELD

The present invention relates generally to test stations for IC (integrated circuit) devices, and more particularly, to a system and method for auto automatically protecting the IC devices from EOS (electro over stress) damage due to occurrence of an undesired DC transient during testing of the IC devices at a test station.

BACKGROUND OF THE INVENTION

During manufacture of IC (integrated circuit) devices, such IC devices are tested at various test stations for determining various performance characteristics of such IC devices. Referring to FIG. 1, one example of such a test station is a burn-in test station 100 for determining the burn-in life time of the IC devices, as known to one of ordinary skill in the art of integrated circuit manufacture. The burn-in life time is a measure of the time period for which an IC device operates properly when the IC device is heated up from room temperature to a raised temperature such as about 125° Celsius or about 150° Celsius, for example, as known to one of ordinary skill in the art of integrated circuit manufacture.

Referring to FIG. 1, the burn-in test station 100 includes a testing board 102 which is placed inside an oven 104 having a heating element 106 for heating up the temperature within the oven 104. The testing board 102 includes a plurality of sockets including a first socket 112, a second socket 114, a third socket 116, a fourth socket 118, a fifth socket 120, and a sixth socket 122. Each of the sockets 112, 114, 116, 118, 120, and 122 holds an IC device during the determination of the burn-in life time of the IC devices A burn-in test station typically has more numerous sockets but six sockets are shown in the testing board 102 of FIG. 1 for clarity of illustration.

A temperature controller 130 coupled to the heating element 106 controls the heating element to set the temperature within the oven such that the IC devices within the sockets 112, 114, 116, 118, 120, and 122 of the testing board 102 heat up from room temperature to a raised temperature such as about 125° Celsius or about 150° Celsius, for example.

With such heating up of the IC devices, a DC (direct current) voltage ($V_{cc}$) is applied from a power voltage supply 132 to some pins of the IC devices within the sockets 112, 114, 116, 118, 120, and 122 of the testing board 102. In addition, another DC (direct current) voltage ($V_{bb}$) is applied from a biasing voltage supply 134 to other pins of the IC devices within the sockets 112, 114, 116, 118, 120, and 122 of the testing board 102. The voltage from the power voltage supply 132 and the biasing voltage supply 134 are used for biasing the IC devices for proper operation of the IC devices, as known to one of ordinary skill in the art of electronics.

With such proper biasing of the IC devices within the sockets 112, 114, 116, 118, 120, and 122 of the testing board 102, driving signals such as clock signals for example are coupled from a signal driver source 136 to the IC devices, as known to one of ordinary skill in the art of electronics. With such heating of the IC devices to the predetermined raised temperature and with proper biasing of the IC devices, the driving signals are repeatedly applied on the IC devices to measure a time period during which the IC devices operate properly. Such a time period is the burn-in life time of the IC devices determined by the burn-in test station 100.

During such a testing procedure within the burn-in test station 100, a DC transient may occur at various components of the burn-in test station 100. As illustrated in FIG. 2, a DC transient 202 is a sudden rise in voltage signal with time. For example, the DC transient 202 may include a voltage increase of about 7 volts.

The DC transient 202 may occur at the node of the power voltage supply 132 that is coupled to the IC devices within the sockets 112, 114, 116, 118, 120, and 122 for providing the power voltage $V_{cc}$ to the IC devices. In addition, the DC transient 202 may also occur at the node of the biasing voltage supply 134 that is coupled to the IC devices for providing the biasing voltage $V_{bb}$ to the IC devices.

Furthermore, the DC transient 202 may also occur at a node of the signal driver source 136 for providing a driving signal to the IC devices. Additionally, the DC transient 202 may also occur at a node of the testing board 102. For example the testing board 102 typically has a ground plane, as known to one of ordinary skill in the art of electronics. The DC transient 202 may occur at such a ground node of the testing board 102.

The DC transient 202 may occur at any of such nodes because such nodes are coupled to the general power system of a room having the test station 100. When a surge of power is drawn within such a power system, such as when another equipment demanding high power is turned on within the room, the DC transient 202 may result at any of the nodes of the power voltage supply 132, the biasing voltage supply 134, the signal driver source 136, and the testing board 102 as described herein.

When the DC transient 202 has a sufficiently high amplitude and/or is of a sufficient duration of time such that the DC transient 202 contributes significant power to the IC devices within the sockets 112, 114, 116, 118, 120, and 122, the IC devices may be damaged due to EOS (electro over stress) failure of the IC devices, as known to one of ordinary skill in the art of integrated circuit manufacture. Such EOS failure may result in premature failure of the IC devices, and the burn-in time of such IC devices may no longer be determined with accuracy.

Thus, a mechanism is desired for automatically protecting the IC devices from EOS (electro over stress) damage due to an undesired DC transient that may occur at a test station such as the burn-in test station.

SUMMARY OF THE INVENTION

Accordingly, in a general aspect of the present invention, nodes of a test station are monitored to detect any undesired DC transient, and a computer controls the components of the test station to properly shut down the test station in a timely manner to automatically protect the IC devices from EOS (electro over stress) damage due to the undesired DC transient.

The test station for testing the IC devices includes a testing board for holding the IC devices during testing of the IC devices. Furthermore, the test station includes at least one voltage supply for biasing the IC devices during testing of the IC devices. In addition, the test station includes a signal driver source for providing driving signals coupled to the IC devices during testing of the IC devices.

In one aspect of the present invention, a system for protecting the IC devices from EOS damage due to the undesired DC transient includes a signal measuring unit that monitors for occurrence of an undesired DC transient at any of the at least one voltage supply, of the signal driver source, and of at least one node of the testing board. The system also includes a data processing unit and a data interface bus coupled between the signal measuring unit and the data processing unit. The signal measuring unit sends, to the data processing unit via the data interface bus, a signal of the undesired DC transient measured at any of the at least one voltage supply, of the signal driver source, and of at least one node of the testing board.

The data processing unit determines whether the signal of the undesired DC transient exceeds threshold characteristics. The data processing unit includes a digital I/O (input/output) controller for controlling components of the test station such that the test station shuts down in a proper sequence when the signal of the undesired DC transient exceeds the threshold characteristics. The threshold characteristics indicate the level of power that may be transferred to the IC devices by the DC transient.

The present invention may be used to particular advantage when the test station includes a temperature controller for setting a temperature within an oven having the IC devices therein for performing a burn-in test on the IC devices. In that case, the proper sequence of shutting down the test station upon detection of a sufficiently undesirable DC transient includes first controlling the temperature controller to reduce the temperature within the oven to about 10° Celsius above room temperature from a raised temperature of about 125° Celsius or about 150° Celsius for example, then turning off the driving signals from the signal driver source, then turning off a biasing voltage supply $V_{bb}$, and then turning off a power voltage supply $V_{cc}$.

With such automatic shutting down of the test station in the proper sequence using data processing control such as computer control, the IC devices are protected from EOS damage from the undesired DC transient. Thus, the testing of the IC devices may resume after such a shutting down of the test station by resetting the test station for determination of failure characteristics such as the burn-in time of the IC devices.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, and 5 refer to elements having similar structure and function.

DETAILED DESCRIPTION

An embodiment of the present invention is described for an example test station for determining the burn-in life time of IC (integrated circuit) devices as described herein. However, the present invention may advantageously be used for protecting IC devices from EOS (electro over stress) damage due to an undesired transient at other types of test stations for testing IC devices, as would be apparent to one of ordinary skill in the art from the description herein.

Figure 3:
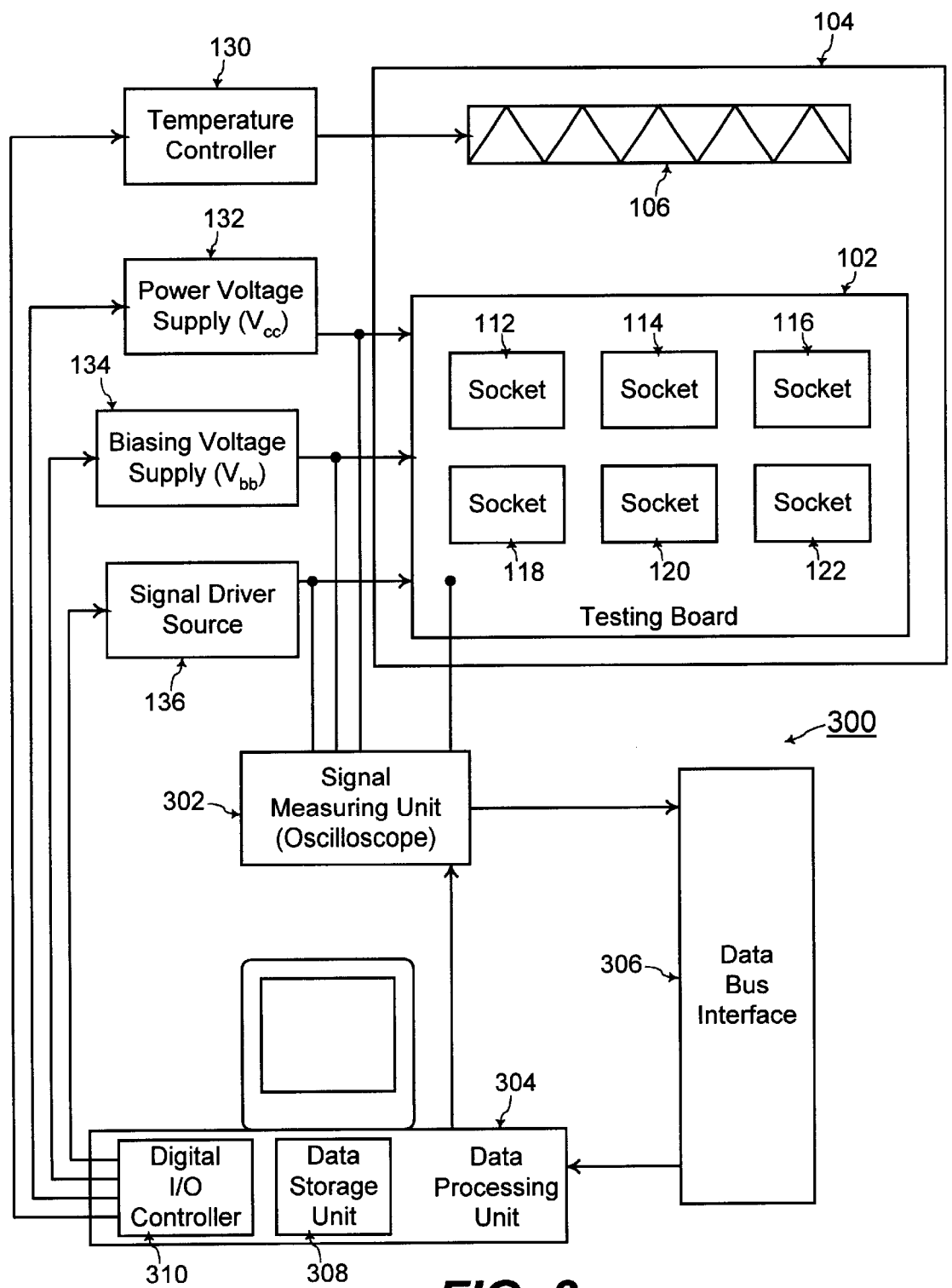
FIG. 3 shows components of a system for automatically protecting IC devices from EOS (electro over stress) damage due to an undesired DC transient at any of a plurality of nodes of the test station of FIG. 1, according to an embodiment of the present invention.

Referring to FIG. 3, a system 300 for automatically protecting IC (integrated circuit) devices from EOS (electro over stress) damage due to an undesired DC transient at the burn-in test station 100 includes a signal measuring unit 302. In one embodiment of the present invention, the signal measuring unit 302 is coupled to the node of the power voltage supply 132 that is coupled to the IC devices within the sockets 112, 114, 116, 118, 120, and 122 for providing the power voltage $V_{cc}$ to the IC devices.

In addition, the signal measuring unit 302 is coupled to the node of the biasing voltage supply 134 that is coupled to the IC devices for providing the biasing voltage $V_{bb}$ to the IC devices. Furthermore, the signal measuring unit 302 is coupled to a node of the signal driver source 136 for providing a driving signal to the IC devices. Additionally, the signal measuring unit 302 is coupled to a node of the testing board 102 such as a ground node of the testing board 102 for example.

The signal measuring unit 302 may be an oscilloscope that is amenable for measuring the voltage signals at each of such nodes. Use of oscilloscopes for measuring voltage signals are known to one of ordinary skill in the art of electronics. The system 300 of FIG. 3 also includes a data processing unit 304 and a bus interface 306 coupled between the signal measuring unit 302 and the data processing unit 304. The data processing unit 304 may be a computer as known to one of ordinary skill in the art of electronics. The signal measuring unit 302 sends voltage signals to the data processing unit 304 via the data bus interface 306, as known to one of ordinary skill in the art of electronics.

The data processing unit 304 includes a data storage unit 308 for storing data and a digital I/O (input/output) controller 310 for sending control signals from the data processing unit 304. Data storage units and digital I/O controllers which are part of a data processing unit such as a computer are known to one of ordinary skill in the art of electronics. The digital I/O controller 310 is coupled to the temperature controller 130, the power voltage supply 132, the biasing voltage supply 134, and the signal driver source 136 of the burn-in test station 100. The data processing unit 304 sends control signals to such components of the burn-in test station 100 via the digital I/O controller 310.

Figure 4:
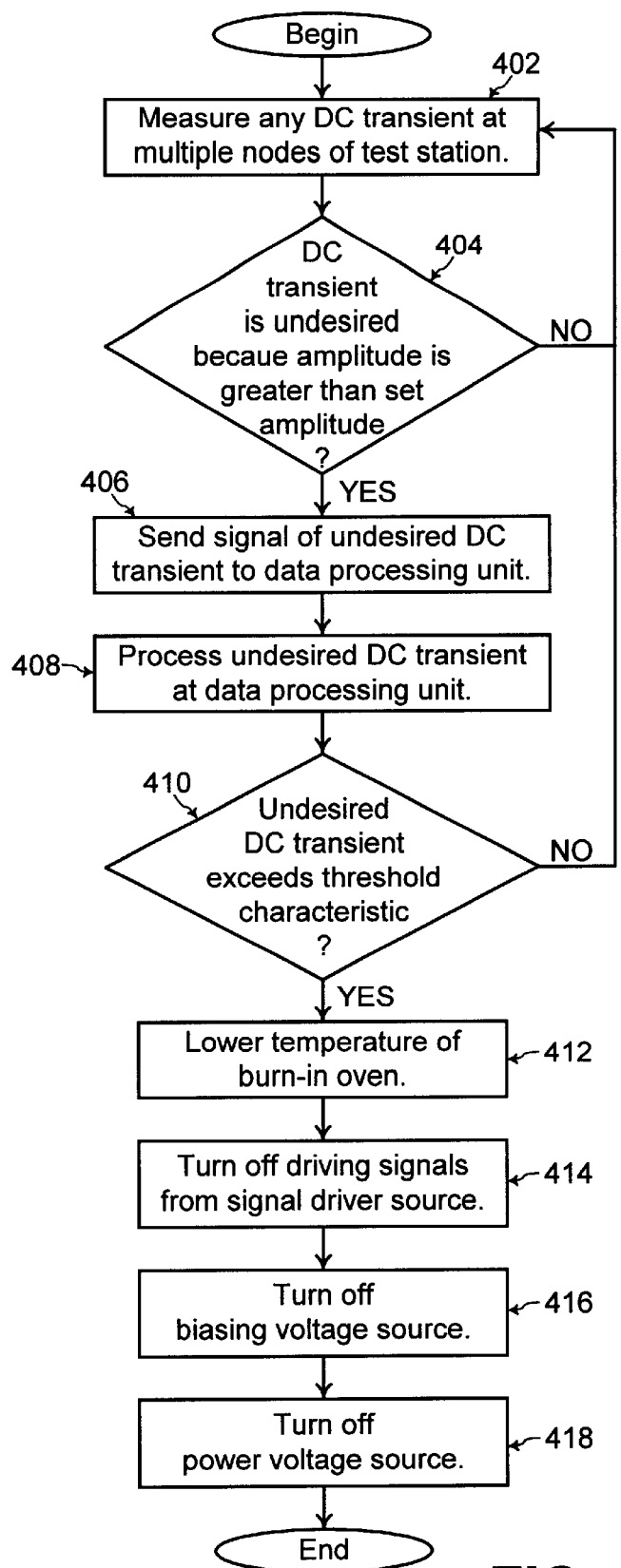
FIG. 4 shows steps of operation of the system of FIG. 3, according to an embodiment of the present invention.

The operation of the system 300 for automatically protecting IC (integrated circuit) devices from EOS (electro over stress) damage due to an undesired DC transient at the burn-in test station 100 is described in reference to the flowchart of FIG. 4. Referring to FIGS. 3 and 4, the signal measuring unit 302 measures a respective voltage signal at each of the node of the power voltage supply 132, the node of the biasing voltage supply 134, the node of the signal driver source 136, and the node of the testing board 102 (step 402 in FIG. 4).

The signal measuring unit 302 detects for the occurrence of any DC transient at such nodes. For example, when the signal measuring unit 302 is an oscilloscope, such an oscilloscope typically has a triggering mechanism that determines when the amplitude of a measured voltage signal exceeds a set amplitude. When a measured voltage signal at any of the node of the power voltage supply 132, the node of the biasing voltage supply 134, the node of the signal driver source 136, and the node of the testing board 102 exceeds the set amplitude, the oscilloscope determines that such a measured voltage signal is an undesired DC transient at that node (step 404 in FIG. 4). If the measured voltage signal is not an undesired DC transient, the signal measuring unit 302 continues to monitor the voltage signals at the node of the power voltage supply 132, the node of the biasing voltage supply 134, the node of the signal driver source 136, and the node of the testing board 102 for any subsequent occurrence of an undesired DC transient (back to step 402 of FIG. 4).

Figure 1:
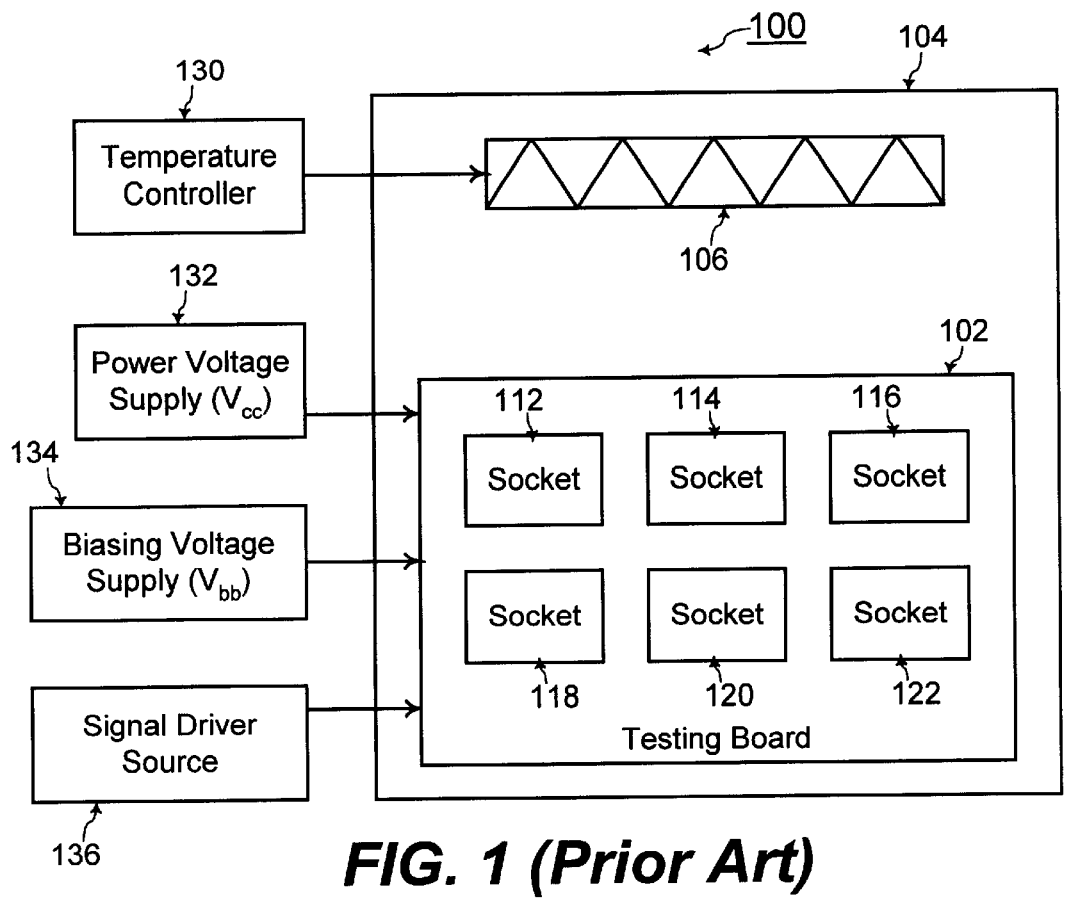
FIG. 1 shows components of a test station for testing IC (integrated circuit) devices such as a burn-in test station, according to the prior art.
Figure 2:
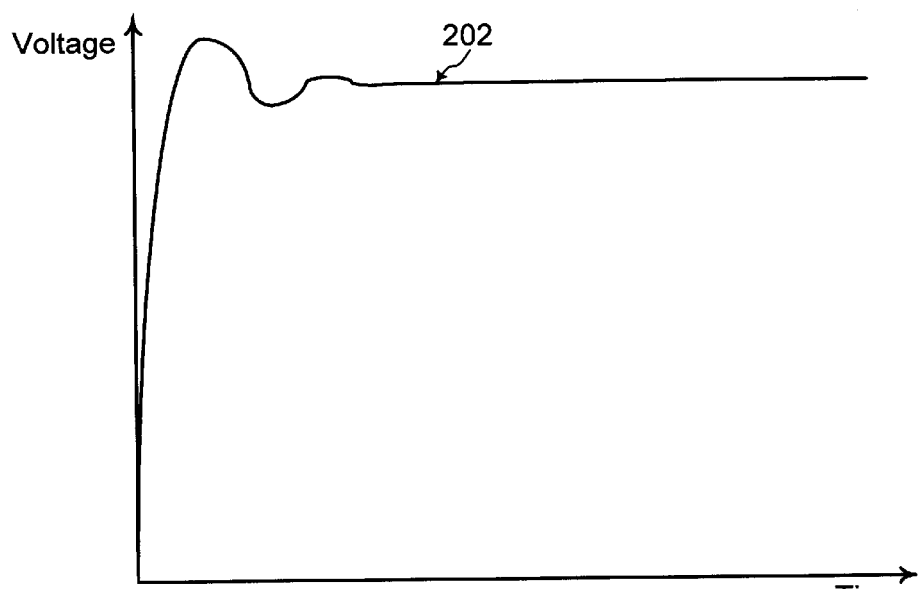
FIG. 2 shows an example signal of a DC transient.

However, if a measured voltage signal at any of the node of the power voltage supply 132, the node of the biasing voltage supply 134, the node of the signal driver source 136, and the node of the testing board 102 is determined to be an undesired DC transient, the signal measuring unit 302 sends the signal of the undesired DC transient to the data processing unit 304 via the data bus interface 306 (step 406 of FIG. 4). The signal of the undesired DC transient is similar to the signal waveform 202 of FIG. 2.

The data processing unit 304 receives the signal of the undesired DC transient to further process such a signal (step 408 of FIG. 4). For example, the data processing unit 304 may determine the peak amplitude or the power of the signal of the undesired DC transient. The data processing unit 304 may also store the signal of the undesired DC transient with a time of occurrence of this undesired DC transient in the data storage unit 308. With such data storage of a history of the occurrence of undesired DC transients, the data processing unit 304 may determine the rate of occurrence of undesired DC transients.

With such processing of the signal of the undesired DC transient, the data processing unit 304 determines whether the signal of the undesired DC transient exceeds threshold characteristics. For example, the data processing unit 304 determines whether the peak amplitude or the power of the signal of the undesired DC transient or the rate of occurrence of undesired DC transients exceeds threshold values (step 410 of FIG. 4).

When any of such characteristics of the signal of the undesired DC transient exceeds a threshold value, the data processing unit 304 controls, via the digital I/O controller 310, components 130, 132, 134, and 136 of the burn-in test station such that the burn-in test station shuts down in a proper sequence (steps 412, 414, 416, and 418 of FIG. 4). On the other hand, when the characteristics of the signal of the undesired DC transient do not exceed the threshold values, the system 300 continues to monitor for the occurrence of any undesired DC transients (back to step 402 of FIG. 4).

Referring to FIGS. 3 and 4, when any of the characteristics of the signal of the undesired DC transient exceeds a threshold value, the data processing unit 304 controls, via the digital I/O controller 310, the temperature controller 130, the power voltage supply 132, the biasing voltage supply 134, and the signal driver source 136 such that the burn-in test station shuts down in a proper sequence. In one embodiment of the present invention, such a proper sequence includes first controlling the temperature controller 130 to reduce the temperature within the oven 104 to about 10° Celsius above room temperature from a raised temperature of about 125° Celsius or about 150° Celsius, for example (step 412 of FIG. 4). The proper sequence includes then turning off the driving signals from the signal driver source 136 (step 414 of FIG. 4), then turning off the biasing voltage supply 134 providing the DC biasing voltage $V_{bb}$ (step 416 of FIG. 4), and then turning off the power voltage supply 132 providing the DC power voltage $V_{cc}$ (step 418 of FIG. 4).

The burn-in test station is shut down is this proper sequence because the IC devices within the testing board 102 may show failure of operation if such a proper sequence is not followed. For example, if the biasing voltage supply 134 providing the DC biasing voltage $V_{bb}$ were erroneously turned off before the power voltage supply 132 providing the DC power voltage $V_{cc}$, the IC devices within the testing board 102 may show failure of operation from such an improper sequence of shutting down the burn-in test station such that the burn-in lifetime of the IC devices may no longer be accurately determined.

In this manner, the signal measuring unit 302 and the data processing unit 304 are used for automatically protecting the IC devices from EOS (electro over stress) damage due to an undesired DC transient that may occur at the burn-in test station during testing of the IC devices. The signal measuring unit 302 monitors for the occurrence of any undesired DC transient at the nodes of the test station that are typically coupled to the power system of the room having the test station therein. The data processing unit 304 shuts down the burn-in test station in a proper sequence when an undesired DC transient may adversely affect the testing of the IC devices at the burn-in test station. After such a shut down in the proper sequence, the burn-in test station may be restarted such that testing of the IC devices within the burn-in test station may resume after the undesired DC transient is no longer present.

Figure 5:
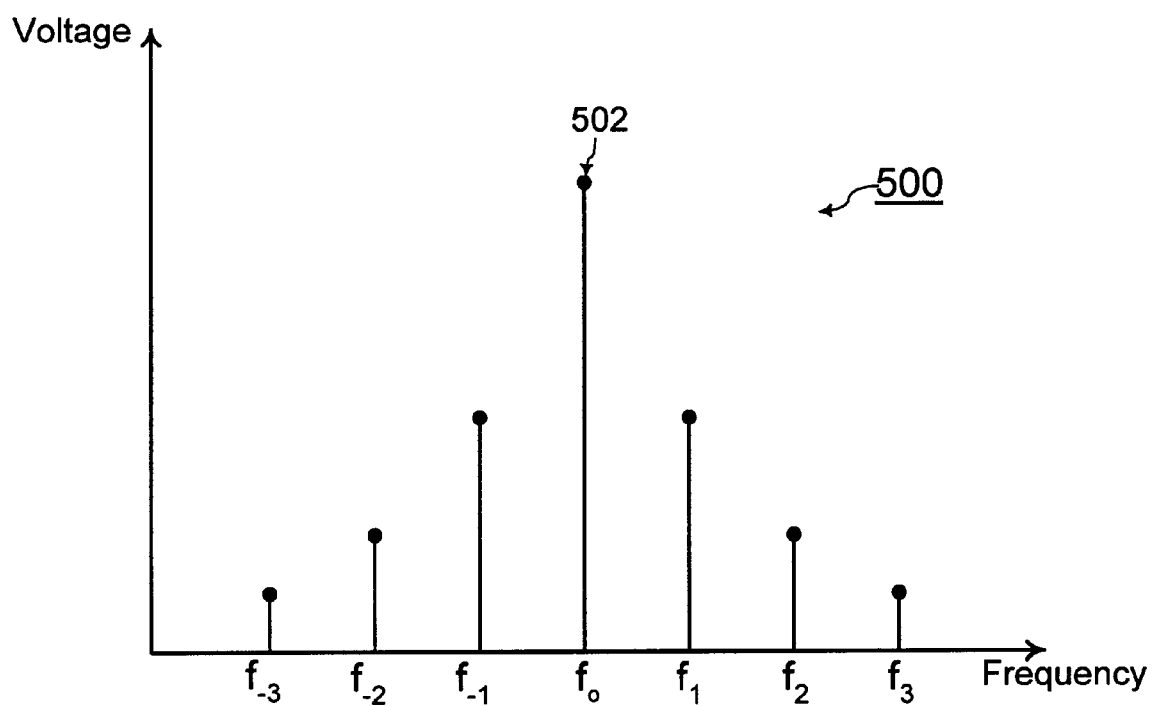
FIG. 5 shows the frequency components of a Fourier transform of the signal of the DC transient of FIG. 2 such that the dominant frequency component of the DC transient may be filtered out from the burn-in test station, according to an embodiment of the present invention.

In another embodiment of the present invention, the data processing unit 304 may further process the signal of the undesired DC transient. For example, the data processing unit 304 may perform a FFT (Fast Fourier Transform) routine on the signal of the undesired DC transient. FIG. 5 shows a typical example of frequency components 500 of such a Fourier transform of the signal of the undesired DC transient. Such FFT routines are known to one of ordinary skill in the art of electronics. Referring to FIG. 5, from the Fourier transform, a dominant frequency component 502 having a highest amplitude may be determined. With determination of the dominant frequency component, a band-pass filter may be placed to filter out the frequency components near the dominant frequency component from the node of the burn-in test station where the undesired DC transient tends to occur. Such band-pass filters are known to one of ordinary skill in the art of electronics.

The foregoing is by way of example only and is not intended to be limiting. For example, the present invention is described for an example test station for determining the burn-in life time of IC (integrated circuit) devices as described herein. However, the present invention may advantageously be used for protecting IC devices from EOS (electro over stress) damage due to an undesired transient at other types of test stations for testing IC devices, as would be apparent to one of ordinary skill in the art from the description herein. The present invention is limited only as defined in the following claims and equivalents thereof.

We claim:

1. A system for automatically protecting IC (integrated circuit) devices from EOS (electro over stress) damage due to an undesired DC transient at a burn-in test station for testing said IC devices, said burn-in test station including a testing board for holding said IC devices, at least one voltage supply for biasing said IC devices, and a signal driver source for providing driving signals coupled to said IC devices, during testing of said IC devices, the system comprising:

a temperature controller for controlling the temperature of said IC devices within a burn-in oven of said burn-in test station;

a signal measuring unit that monitors for occurrence of an undesired DC transient at any of said at least one voltage supply, of said signal driver source, and of at least one node of said testing board;

a data processing unit; and a data interface bus coupled between said signal measuring unit and said data processing unit;

wherein said signal measuring unit sends, to said data processing unit via said data interface bus, a signal of said undesired DC transient measured at any of said at least one voltage supply, of said signal driver source, and of at least one node of said testing board;

and wherein said data processing unit determines whether said signal of said undesired DC transient exceeds threshold characteristics;

and wherein said data processing unit includes an I/O (input/output) controller coupled to said temperature controller, said at least one voltage supply, and said signal driver source, such that said I/O controller controls said temperature controller to lower the temperature of said IC devices within said burn-in oven and such that said I/O controller shuts down said at least one voltage supply and said signal driver source, in a proper sequence when said signal of said undesired DC transient exceeds said threshold characteristics;

and wherein said I/O controller is coupled to said temperature controller for ensuring that the temperature of said IC devices within said burn-in oven is lowered in a proper sequence with respect to shutting down said at least one voltage supply and said signal driver source.

2. The system of claim 1, wherein said test station includes a temperature controller for setting a temperature within an oven having said IC devices therein for performing a burn-in test on said IC devices.

3. The system of claim 2, wherein said proper sequence of shutting down said test station includes first controlling the temperature controller to reduce the temperature within the oven to about 10° Celsius above room temperature from a raised temperature, then turning off said driving signals from said signal driver source, then turning off a biasing voltage supply $V_{bb}$, and then turning off a power voltage supply $V_{cc}$.

4. The system of claim 1, wherein said data processing unit includes a data storage unit for storing said signal of said undesired DC transient and for storing a time of when said undesired DC transient has been measured by said signal measuring unit.

5. The system of claim 1, wherein said data processing unit performs a FFT (Fast Fourier Transform) routine on said signal of said undesired DC transient to determine a dominant frequency component of said signal of said undesired DC transient.

6. The system of claim 5, wherein a bandpass filter for filtering out said dominant frequency component of said signal of said undesired DC transient is coupled to one of said at least one voltage supply, of said signal driver source, and of at least one node of said testing board where said undesired DC transient has been measured to filter out said dominant frequency component of said signal of said undesired DC transient.

7. The system of claim 1, wherein said threshold characteristics include one of amplitude of said signal of said undesired DC transient, power of said signal of said undesired DC transient, and rate of occurrence of undesired DC transients.

8. The system of claim 1, wherein said signal measuring unit is an oscilloscope having a triggering mechanism that sends said signal of said undesired DC transient to said data processing unit when an amplitude of said signal of said undesired DC transient is greater than a set amplitude.

9. The system of claim 1, wherein said data processing unit is a computer.

10. A system for automatically protecting IC (integrated circuit) devices from EOS (electro over stress) damage due to an undesired DC transient at a burn-in test station for testing said IC devices, said burn-in test station including a testing board for holding said IC devices, at least one voltage supply for biasing said IC devices, and a signal driver source for providing driving signals coupled to said IC devices, the system comprising:

a temperature controller for controlling the temperature of said IC devices within a burn-in oven of said burn-in test station;

a signal measuring unit that monitors for occurrence of an undesired DC transient at any of said at least one voltage supply, of said signal driver source, and of at least one node of said testing board;

a data processing unit, wherein said data processing unit is a computer; and a data interface bus coupled between said signal measuring unit and said data processing unit;

wherein said signal measuring unit sends, to said data processing unit via said data interface bus, a signal of said undesired DC transient measured at any of said at least one voltage supply, of said signal driver source, and of at least one node of said testing board, and wherein said signal measuring unit is an oscilloscope having a triggering mechanism that sends said signal of said undesired DC transient to said data processing unit when an amplitude of said signal of said undesired DC transient is greater than a set amplitude;

and wherein said data processing unit includes a data storage unit for storing said signal of said undesired DC transient and for storing a time of when said undesired DC transient has been measured by said signal measuring unit;

and wherein said data processing unit determines whether said signal of said undesired DC transient exceeds threshold characteristics, and wherein said threshold characteristics include one of amplitude of said signal of said undesired DC transient, power of said signal of said undesired DC transient, and rate of occurrence of undesired DC transients;

and wherein said data processing unit includes an I/O (input/output) controller coupled to said temperature controller, said at least one voltage supply, and said signal driver source, such that said I/O controller controls said temperature controller to lower the temperature of said IC devices within said burn-in oven and such that said I/O controller shuts down said at least one voltage supply and said signal driver source, in a proper sequence when said signal of said undesired DC transient exceeds said threshold characteristics;

and wherein said I/O controller is coupled to said temperature controller for ensuring that the temperature of said IC devices within said burn-in oven is lowered in a proper sequence with respect to shutting down said at least one voltage supply and said signal driver source;

and wherein said proper sequence of shutting down said test station includes first controlling the temperature controller to reduce the temperature within the oven to about 10° Celsius above room temperature from a raised temperature of about 125° Celsius or about 150° Celsius, then turning off said driving signals from said signal driver source, then turning off a biasing voltage supply $V_{bb}$, and then turning off a power voltage supply $V_{cc}$;

and wherein said data processing unit performs a FFT (Fast Fourier Transform) routine on said signal of said undesired DC transient to determine a dominant frequency component of said signal of said undesired DC transient;

and wherein a bandpass filter for filtering out said dominant frequency component of said signal of said undesired DC transient is coupled to one of said at least one voltage supply, said signal driver source, and at least one node of said testing board where said undesired DC transient has been measured to filter out said dominant frequency component of said signal of said undesired DC transient.

11. A method for automatically protecting IC (integrated circuit) devices from EOS (electro over stress) damage due to an undesired DC transient at a burn-in test station for testing said IC devices, said burn-in test station including a testing board for holding said IC devices, at least one voltage supply for biasing said IC devices, and a signal driver source for providing driving signals coupled to said IC devices, during testing of said IC devices, the method including the steps of:

controlling by a temperature controller the temperature of said IC devices within a burn-in oven of said burn-in test station;

measuring a signal of an undesired DC transient at any of said at least one voltage supply, of said signal driver source, and of at least one node of said testing board;

sending to a data processing unit, via a data interface bus, said signal of said undesired DC transient measured at any of said at least one voltage supply, of said signal driver source, and of at least one node of said testing board;

determining by said data processing unit whether said signal of said undesired DC transient exceeds threshold characteristics;

controlling by said data processing unit said temperature controller to lower the temperature of said IC devices within said burn-in oven, and controlling by said data processor said at least one voltage supply and said signal driver source to shut down, in a proper sequence when said signal of said undesired DC transient exceeds said threshold characteristics; and controlling by said data processing unit said temperature controller for ensuring that the temperature of said IC devices within said burn-in oven is lowered in a proper sequence with respect to shutting down said at least one voltage supply and said signal driver source.

12. The method of claim 11, wherein said test station includes a temperature controller for setting a temperature within an oven having said IC devices therein for performing a burn-in test on said IC devices.

13. The method of claim 12, wherein said proper sequence of shutting down said test station includes the steps of:

controlling the temperature controller to reduce the temperature within the oven to about 10° Celsius above room temperature from a raised temperature;

turning off said driving signals from said signal driver source;

turning off a biasing voltage supply $V_{bb}$; and turning off a power voltage supply $V_{cc}$.

14. The method of claim 11, further including the step of:

storing, at a data storage unit of said data processing unit, said signal of said undesired DC transient and a time of when said undesired DC transient has been measured.

15. The method of claim 1, further including the step of:

performing by said data processing unit a FFT (Fast Fourier Transform) routine on said signal of said undesired DC transient to determine a dominant frequency component of said signal of said undesired DC transient.

16. The method of claim 15, further including the step of:

filtering out with a bandpass filter said dominant frequency component of said signal of said undesired DC transient at one of said at least one voltage supply, of said signal driver source, and of at least one node of said testing board where said undesired DC transient has been measured.

17. The method of claim 11, wherein said threshold characteristics include one of amplitude of said signal of said undesired DC transient, power of said signal of said undesired DC transient, and rate of occurrence of undesired DC transients.

18. The method of claim 11, wherein said data processing unit is a computer.

* * * * *